United States Patent
Jung et al.

[11] Patent Number: 5,973,345
[45] Date of Patent: *Oct. 26, 1999

[54] SELF-BOOTSTRAPPING DEVICE

[75] Inventors: Chang Ho Jung; Hoi Jun Yoo; Kee Woo Park, all of Kyoungki-do, Rep. of Korea

[73] Assignee: Hyundai Electrinics Industries Co., Ltd., Kyoungki-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/580,958

[22] Filed: Dec. 27, 1995

[30] Foreign Application Priority Data

Dec. 31, 1994 [KR] Rep. of Korea ........................ 94-40581

[51] Int. Cl.⁶ ................................................. H01L 27/108
[52] U.S. Cl. ........................................... 257/299; 257/401
[58] Field of Search .................................... 257/299, 401

[56] References Cited

U.S. PATENT DOCUMENTS

| | | | |
|---|---|---|---|
| 3,714,525 | 1/1973 | Brown et al. | 317/235 R |
| 4,620,299 | 10/1986 | Remington et al. | 365/230 |
| 5,153,683 | 10/1992 | Noda | 357/22 |

FOREIGN PATENT DOCUMENTS

| | | |
|---|---|---|
| 0463623 A2 | 1/1992 | European Pat. Off. . |
| 52-50182 | 4/1977 | Japan . |
| 04010474 | 1/1992 | Japan . |
| 6260639 | 9/1994 | Japan . |
| 2033656 | 5/1980 | United Kingdom . |
| 2081012 | 2/1982 | United Kingdom . |

*Primary Examiner*—Sara Crane
*Attorney, Agent, or Firm*—Gary M. Nath; Harold L. Novick; Nath & Associates

[57] ABSTRACT

A self-bootstrapping device for sufficiently bootstrapping a bias applied to the gate of a MOS transistor included in the decoder of a semiconductor memory device requiring a high integration degree so that the MOS transistor can transmit the potential from its drain to its source. The self-bootstrapping device includes a first NMOS transistor for a signal transmission, and a second NMOS transistor connected between the gate of the first NMOS transistor and an address decoder circuit, the second NMOS transistor being applied at its gate with a source voltage, wherein the second NMOS transistor comprises a first diffusion region formed at a required portion of a semiconductor substrate, a second diffusion region formed around the first diffusion region while being spaced apart from the first diffusion region by a desired distance, and a gate electrode formed on the semiconductor substrate between the first and second diffusion regions.

3 Claims, 4 Drawing Sheets

SELF-BOOTSTRAPPING DEVICE

BACKGROUND OF THE INVENTION

1. Field of the Invention

The present invention relates to a self-bootstrapping device, and more particularly to a self-bootstrapping device for sufficiently bootstrapping a bias applied to the gate of a MOS transistor included in the decoder of a semiconductor memory device requiring a high integration degree so that the MOS transistor can transmit the potential from its drain to its source.

2. Description of the Prior Art

Conventionally, self-bootstrapping devices have been used as decoders for decoding word lines of semiconductor memory devices in order to increase the integration of such semiconductor devices. Such self-bootstrapping devices also serve to boost an operating voltage to a level higher than the source voltage, thereby enabling word lines of memory devices to be effectively decoded.

NMOS transistors included in semiconductor memory devices, which may be those adapted to decode word lines or those included in pull-up drivers of data out buffers and coupled to the source voltage, need a gate potential higher than the sum of a drain potential and a threshold voltage.

In this connection, a scheme has been proposed, which uses a level shifter for boosting the potential at a particular node to a level considerably higher than the source voltage. This method is illustrated in FIG. 1 in which the level shifter is denoted by the reference numeral 10. The level shifter 10 serves to boost the output from an address decoder circuit 20. A boosted signal from the level shifter 10 is applied to the gate of an NMOS transistor Q1. In this case, the boosted voltage Vpp output from the level shifter 10 should be higher than the maximum potential at the source or drain of the NMOS transistor Q1, namely, the source voltage Vcc by a value corresponding to the threshold voltage. In this case, however, it is required to use a separate voltage supply source. Since the high level source voltage should be used at highly dense regions in this case, it may adversely affect the memory device. For example, the stability of the memory device may be degraded.

In order to solve such problems, another scheme has been proposed, wherein a self-bootstrapping device is used. In this case, two NMOS transistors are used, on of which serves to perform a signal transmission. To the gate of the signal transmission NMOS transistor, the other NMOS transistor is coupled at its drain. With such a construction, the signal transmission NMOS transistor has a gate voltage self-bootstrapped in accordance with a variation in its drain voltage.

Such a self-bootstrapping device is illustrated in FIG. 2. In this self-bootstrapping device, the signal transmission NMOS transistor, which may be that of FIG. 1, is supplied at its gate with the drain voltage of the other NMOS transistor in place of an externally input particular voltage. In FIG. 2, the NMOS transistor requiring the bootstrap is the transistor Q2. The other NMOS transistor Q3 is coupled at its source to the gate of the NMOS transistor Q2. The NMOS transistor Q3 is also coupled to an address decoder circuit 20. A gate capacitor C1 for the NMOS transistor Q2 is formed between the source and gate of the NMOS transistor Q2. A gate overlap capacitor C2 is also formed between the gates of the NMOS transistors Q2 and Q3. A junction capacitor C3 is also formed because both the gate of the NMOS transistor Q2 and the source of the NMOS transistor Q3 have N' diffusion regions formed in a P' substrate, respectively.

FIG. 3A illustrates the layout of a bootstrapping transistor used in conventional self-bootstrapping devices. FIG. 3B is a cross-sectional view taken along the line A—A' of FIG. 3A. This transistor includes a pair of $n^+$ diffusion regions formed at desired portions of a semiconductor substrate and spaced apart from each other by a desired distance, and a gate electrode formed over the substrate between the $n^+$ diffusion regions.

The operation of the self-bootstrapping device having the above-mentioned construction will now be described in conjunction with FIG. 2. When the address decoder circuit 20 operates in response to an address input signal Ai applied thereto, it outputs a signal having a level corresponding to the source voltage Vcc. As a result, the NMOS transistor Q2 is applied at its gate with a voltage corresponding to the difference between the source voltage Vcc and the threshold voltage Vth. When the drain potential of the NMOS transistor Q2 increases up to an optional voltage Vx less than the voltage difference between Vcc and Vth, the gate potential of the NMOS transistor Q2 is self-bootstrapped by the capacitor C1 formed between the gate and source of the transistor Q2. As a result, the source potential of the NMOS transistor Q2 increases. At this time, the NMOS transistor turns off because the potential difference between its gate and source becomes lower than the threshold voltage.

In this case, the level of the self-bootstrapped voltage is determined by the co-relationship among the gate overlap capacitor C2, the junction capacitor C3 and the gate capacitor C1 of NMOS transistor Q2. In other words, the self-bootstrapped voltage level is proportional to the value of C1/(C1+C2+C3).

On the other hand, the NMOS transistor Q2 has a compact size when it is used in highly densely integrated semiconductor memory devices. In this case, however, the NMOS transistor Q3 is difficult to be compact in proportion to the compactness of the NMOS transistor Q2 due to various reasons involved in the fabrication thereof. As a result, the junction capacitor C3 has a relatively increased capacitance, as compared to the capacitor C1. This results in a decrease in the value of C1/(C1+C2+C3), thereby dropping the bootstrapped voltage level of the NMOS transistor Q2.

SUMMARY OF THE INVENTION

Therefore, an object of the invention is to provide a self-bootstrapping device capable of decreasing the capacitance of the junction capacitor in highly densely integrated semiconductor memory devices, thereby increasing the gate potential of the NMOS transistor used for a signal transmission to a level higher than the sum of the drain potential and threshold voltage of the NMOS transistor.

In accordance with one aspect, the present invention provides a self-bootstrapping device including a first NMOS transistor for a signal transmission, and a second NMOS transistor connected between the gate of the first NMOS transistor and an address decoder circuit, the second NMOS transistor being applied at its gate with a source voltage, wherein the second NMOS transistor comprises: a first diffusion region formed at a required portion of a semiconductor substrate; a second diffusion region formed around the first diffusion region while being spaced apart from the first diffusion region by a desired distance; and a gate electrode formed over the semiconductor substrate between the first and second diffusion regions.

In accordance with another aspect, the present invention provides a self-bootstrapping device including a first NMOS transistor for a signal transmission, and a second NMOS transistor connected between the gate of the first NMOS transistor and an address booster circuit, the second NMOS transistor being applied at its gate with a source voltage, wherein the second NMOS transistor comprises: a pair of diffusion regions formed in a semiconductor substrate while being spaced apart from each other by a desired distance, one of the diffusion regions being doped with impurity ions in a high concentration, and the other diffusion region being doped with impurity ions in a low concentration; and a gate electrode formed over the semiconductor substrate between the diffusion regions.

BRIEF DESCRIPTION OF THE DRAWINGS

The above and other objects, features and advantages of the present invention will be more clearly understood from the following detailed description taken in conjunction with the accompanying drawings in which.

DETAILED DESCRIPTION OF THE PREFERRED EMBODIMENTS

Figure 4:
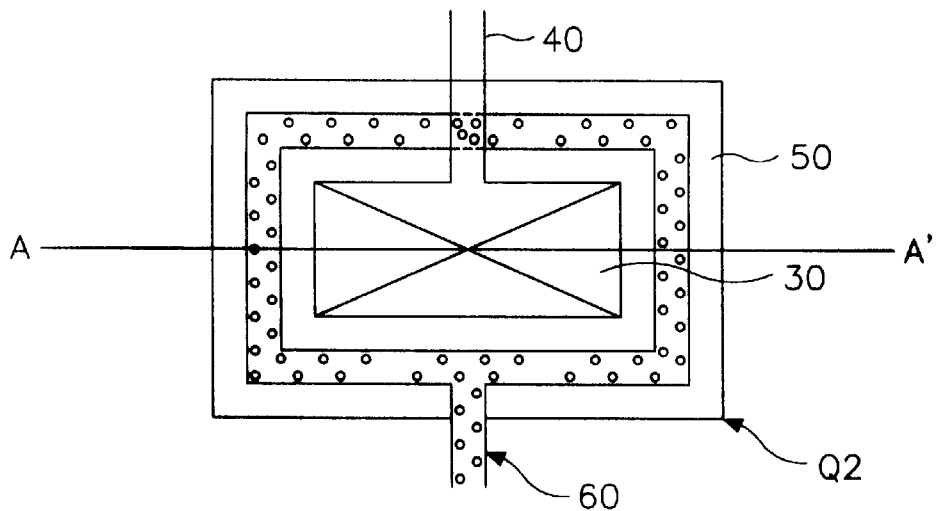
FIG. 4 is a plan view illustrating the layout of a self-bootstrapping transistor included in a self-bootstrapping device in accordance with a first embodiment of the present invention.

FIG. 4 illustrates the layout of a self-bootstrapping transistor included in a self-bootstrapping device in accordance with a first embodiment of the present invention. On the other hand, FIG. 5 is a cross-sectional view taken along the line A—A' of FIG. 4.

Figure 5:
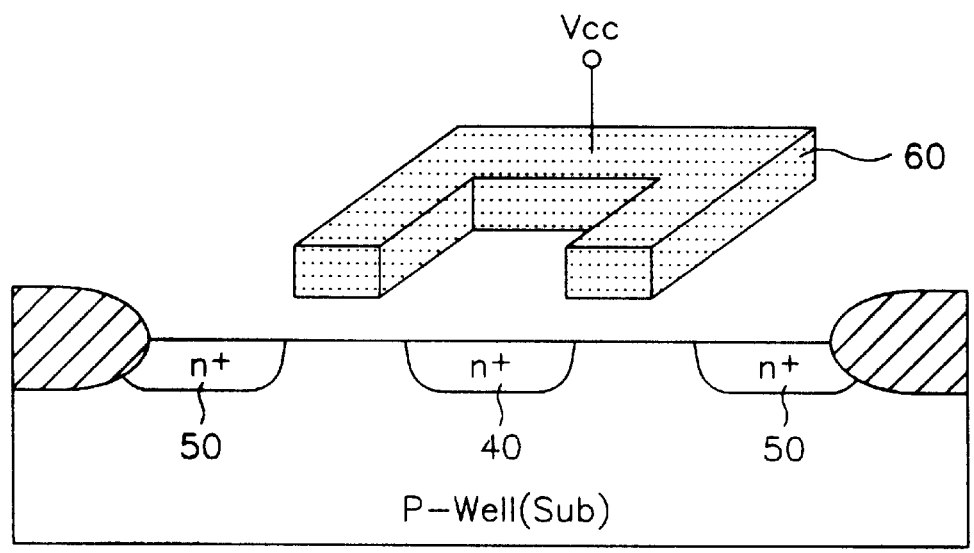
FIG. 5 is a cross-sectional view taken along the line A—A' of FIG. 4.

As shown in FIGS. 4 and 5, the self-bootstrapping transistor has a drain 40 defined by an $n^+$ diffusion region formed at a desired portion of a semiconductor substrate. The transistor also has a source 50 disposed around the drain 40 while being spaced apart from the drain 40 by a desired distance. The source 50 is defined by another $n^+$ diffusion region formed in the semiconductor substrate around the $n^+$ diffusion region of the drain 40 while being spaced apart from the latter $n^+$ diffusion region. The transistor further has a gate electrode 60 formed on the semiconductor substrate between the drain 40 and source 50. In order to minimize the size of the diffusion region of the drain 40, a single contact 30 having a minimum unit size, which is made of metal or polycide, is provided at the drain 40. The drain 40, source 50 and gate electrode 60 each has a rectangular or annular structure surrounding the contact 30.

Figure 1:
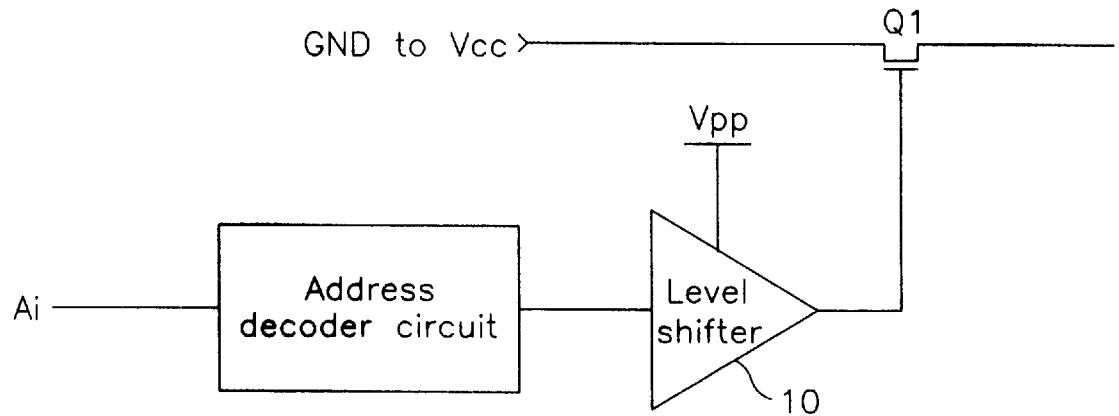
FIG. 1 is a circuit diagram illustrating a conventional self-bootstrapping device.
Figure 2:
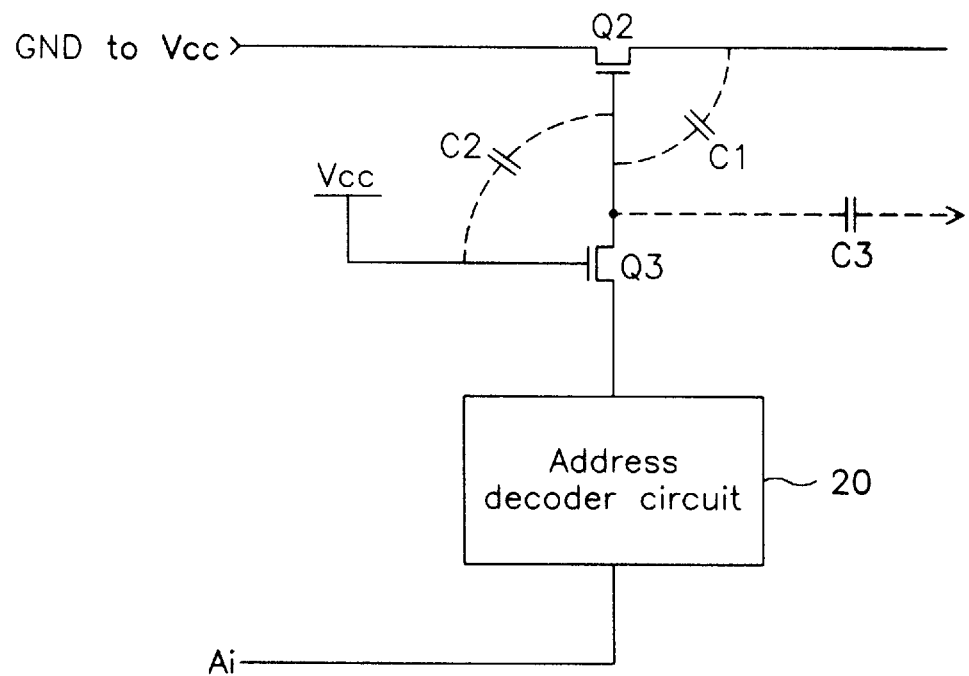
FIG. 2 is a circuit diagram illustrating another conventional self-bootstrapping device.
Figure 3A:
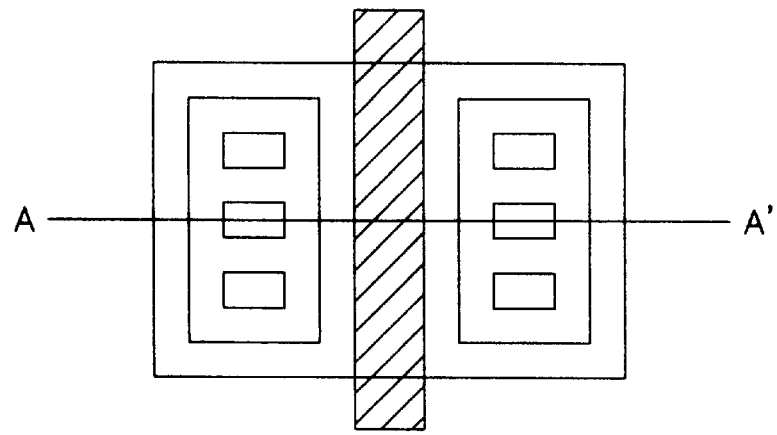
FIG. 3A is a plan view illustrating the layout of a bootstrapping transistor used in conventional self-bootstrapping devices.
Figure 3B:
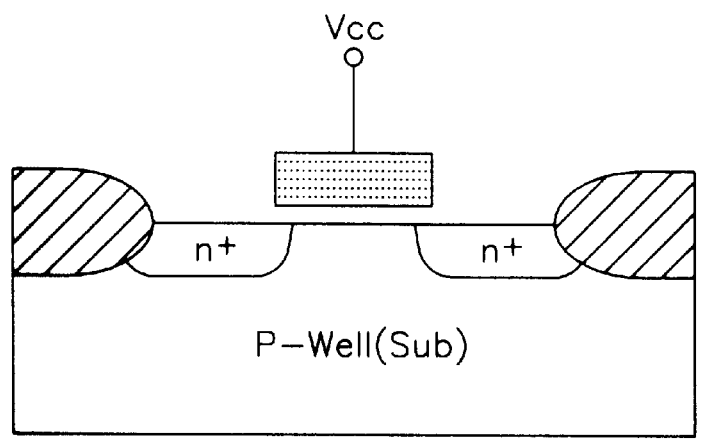
FIG. 3B is a cross-sectional view taken along the line A—A' of FIG. 3A.

FIG. 3 is a sectional view illustrating a self-bootstrapping transistor included in a self-bootstrapping device in accordance with a second embodiment of the present invention.

Figure 6:
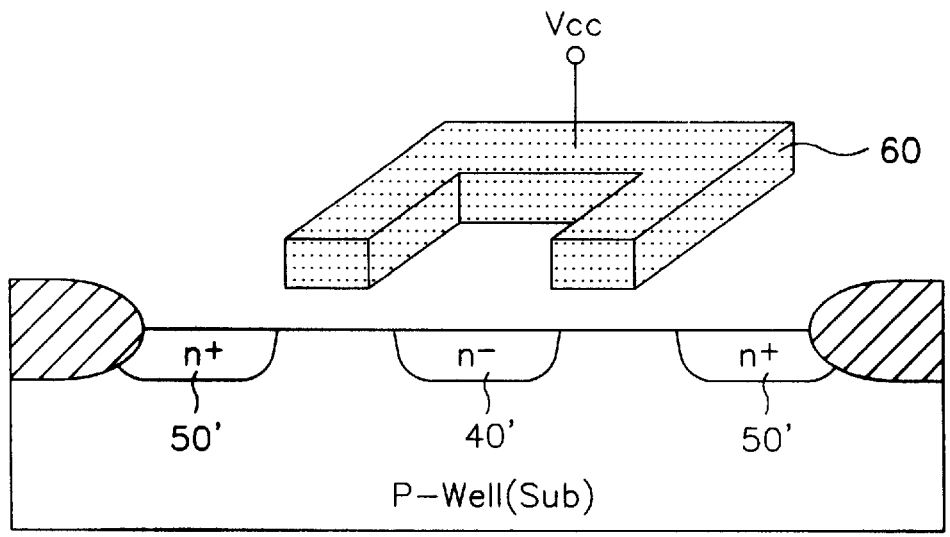
FIG. 6 is a sectional view illustrating a self-bootstrapping transistor included in a self bootstrapping device in accordance with a second embodiment of the present invention.

As shown in FIG. 6, this self-bootstrapping transistor has a drain 40' defined by an n diffusion region formed at a desired portion of semiconductor substrate. A source 50' is disposed around the drain 40' while being spaced apart from the drain 40' by a desired distance. The source 50' is defined by another n' diffusion region formed in the semiconductor substrate around the $n^-$ diffusion region of the drain 40 while being spaced apart from the $n^-$ diffusion region. The transistor also has a gate electrode 60' formed on the semiconductor substrate between the drain 40' and source 50'. Similar to the structure of FIG. 5, a single contact 30 having a minimum unit size, which is made of metal or polycide, is provided at the drain 40' in order to minimize the size of the diffusion region of the drain 40'. The drain 40', source 50' and gate electrode 60' each has a rectangular or annular structure surrounding the contact 30.

In accordance with this embodiment, only the $N^-$ diffusion region is used for a junction by use of a well-known N MOS technique in which $N^+$ regions of a lightly doped drain (LDD) structure are masked. Accordingly, the junction capacitance resulting from N' diffusion regions formed in the substrate of $P^+$ type decreases. In the case of highly densely integrated circuits, accordingly, it is possible to efficiently self-bootstrap the gate potential of each MOS transistor.

Figure 7:
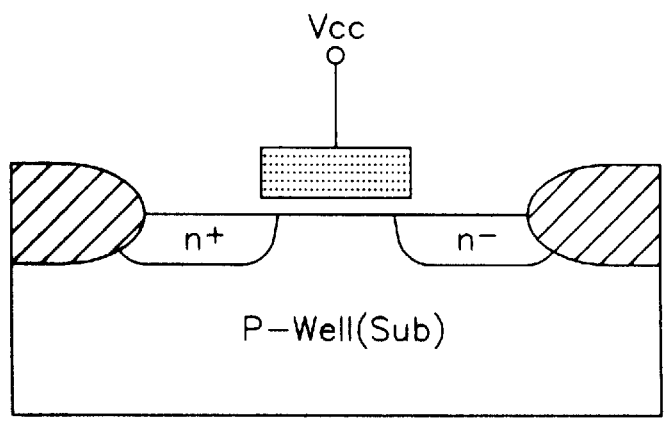
FIG. 7 is a sectional view illustrating a self-bootstrapping transistor included in a self-bootstrapping device in accordance with a third embodiment of the present invention.

FIG. 7 is a sectional view illustrating a self-bootstrapping transistor included in a self-bootstrapping device in accordance with a third embodiment of the present invention.

As shown in FIG. 6, this self-bootstrapping transistor has an n' diffusion region and $n^-$ diffusion region both formed at desired portions of a semiconductor substrate while being spaced apart from each other by a desired distance. A gate electrode 60 is formed over the semiconductor substrate between the n' and $n^-$ diffusion regions.

As apparent from the above description, the present invention provides an NMOS transistor having a self-bootstrapping function. In accordance with the present invention, such an NMOS transistor can be fabricated using the well-known processing and fabricating techniques. The present invention reduces the junction capacitance resulting from $N^+$ diffusion regions formed in the P' substrate. In highly densely integrated circuits, accordingly, it is possible to efficiently self bootstrap the gate potential of each MOS transistor.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A self-bootstrapping device including a first NMOS transistor for a signal transmission, and a second NMOS transistor connected between the gate of the first NMOS transistor and an address decoder circuit, the second NMOS transistor being applied at its gate with a source voltage:

wherein a first diffusion region of the second NMOS transistor is coupled with the gate of the first NMOS transistor;

a second diffusion region of the second NMOS transistor is coupled with the address decoder circuit, the first diffusion region is doped with impurity ions in n– concentration, the second diffusion region is doped with impurity ions in n+ concentration; and the first diffusion region is smaller than the second diffusion region.

2. The self-bootstrapping device in accordance with claim 1, wherein a size of the first diffusion region is identical to the size of a unit contact area which is formed in the first diffusion region.

3. The self-bootstrapping device in accordance with claim 2, wherein each of the first and second diffusion regions and gate electrode of the second NMOS transistor has a rectangular or annular structure surrounding the contact.

* * * * *